(12) United States Patent
Galloway et al.

(10) Patent No.: US 7,907,079 B1
(45) Date of Patent: Mar. 15, 2011

(54) DELTA SIGMA MODULATOR FOR ANALOG-TO-DIGITAL CONVERTER

(75) Inventors: Brian Jeffrey Galloway, Hoschton, GA (US); Andrew Cole, Sunnyvale, CA (US)

(73) Assignee: Foveon, Inc., Santa Clara, CA (US)

( * ) Notice: Subject to any disclaimer, the term of this patent is extended or adjusted under 35 U.S.C. 154(b) by 57 days.

(21) Appl. No.: 12/331,024

(22) Filed: Dec. 9, 2008

Related U.S. Application Data

(60) Provisional application No. 61/030,495, filed on Feb. 21, 2008.

(51) Int. Cl.
*H03M 1/56* (2006.01)
(52) U.S. Cl. .......................................... 341/169; 341/155
(58) Field of Classification Search .................. 341/169, 341/143, 155, 156, 161, 166, 118, 120; 382/312; 348/294, 297
See application file for complete search history.

(56) References Cited

U.S. PATENT DOCUMENTS

| | | | |
|---|---|---|---|
| 3,349,390 A | 10/1967 | Glassman | |
| 3,480,948 A | 11/1969 | Lord | |
| 3,760,407 A | 9/1973 | Terry | |
| 4,338,589 A | 7/1982 | Engel et al. | |
| 5,907,299 A * | 5/1999 | Green et al. | 341/143 |
| 6,243,034 B1 * | 6/2001 | Regier | 341/166 |
| 6,720,999 B1 | 4/2004 | Holberg et al. | |
| 6,987,536 B2 | 1/2006 | Olding et al. | |
| 7,012,557 B2 | 3/2006 | Takayanagi et al. | |
| 7,286,176 B2 | 10/2007 | Holberg et al. | |
| 7,310,452 B2 * | 12/2007 | Nam | 382/312 |
| 7,570,185 B2 | 8/2009 | Rao et al. | |
| 2002/0140834 A1 | 10/2002 | Olding et al. | |
| 2006/0249655 A1 * | 11/2006 | Lee | 250/208.1 |
| 2008/0266155 A1 | 10/2008 | Ang et al. | |

FOREIGN PATENT DOCUMENTS

| | | |
|---|---|---|
| JP | 2006050231 A | 2/2006 |
| JP | 2006191588 A | 7/2006 |

OTHER PUBLICATIONS

Notice of Allowance in corresponding Japanese Patent No. 2009-039608 filed Feb. 23, 2009 and published as JP 2009-201113 on Sep. 3, 2009 entitled "Delta Sigma Modulator For Analog-To-Digital Converter.".

* cited by examiner

*Primary Examiner* — Joseph Lauture
(74) *Attorney, Agent, or Firm* — Lewis and Roca LLP

(57) ABSTRACT

A method for operating a single slope analog-to-digital converter (ADC) includes providing a ramp generator to provide at least one voltage-ramp segment; applying delta-sigma modulation to the voltage-ramp generator to generate a delta-sigma modulated voltage ramp; operating a digital counter synchronously with the voltage-ramp generator; comparing the delta-sigma modulated voltage-ramp to an input voltage; and latching a count from the digital counter in response to the output of the comparator.

5 Claims, 6 Drawing Sheets

DELTA SIGMA MODULATOR FOR ANALOG-TO-DIGITAL CONVERTER

CROSS-REFERENCE TO RELATED APPLICATIONS

This application claims priority to U.S. Provisional Patent Application Ser. No. 61/030,495, filed Feb. 21, 2008, the entirety of which is incorporated by reference herein.

BACKGROUND OF THE INVENTION

1. Field of the Invention

The present invention relates to analog-to-digital converters and to companding analog-to-digital converters an architecture commonly known as "single slope ADC's". More particularly, the present invention relates to an analog-to-digital converter with digital calibration that allows programmable control of the ramp slope.

2. The Prior Art

"Single slope ADC's" is the common name given to a family of analog-to-digital converters employs a ramp voltage generator, a digital counter, an analog front end sampling section, a comparator that compares the analog input voltage with the generated ramp voltage, and a digital latch.

In a simple well-known case, the ramp voltage follows a linear function. To reduce the conversion time, the ramp voltage may be "accelerated" by using a segmented ramp function as shown in FIG. 1A. Initially, in SEGMENT(1) the ramp in FIG. 1A runs with a unit step size (STEP(1)=1*LSB or 1× ramp rate). After a specified number of clock pulses, in SEGMENT(2) the ramp rate is increased to twice the unit step size (STEP(2) or 2× ramp rate). The count at which the transition from STEP(1) to STEP(2) occurs is may be referred to as Knee(1). After counting for a certain number of steps at a 2× ramp rate, the rate is doubled again in SEGMENT(3) to STEP(4) or a 4× ramp rate. This occurs at a count that may be referred to as Knee(2). Further doubling in SEGMENT(4) results in STEP(8) at count Knee(3). At the same knee points the ramp counter increases the count steps size by 2× so that the overall ADC transfer function is linear. Companding is also done in the prior art to take advantage of the fact that the absolute level of the noise in most natural source signals increases with the signal value so that increased ADC quantization noise at larger input signal values is masked by input noise and thus the "quality" (SNR) of the ADC conversion does not decrease at higher levels. Image sensors are an example of such an application.

Persons of ordinary skill in the art will readily appreciate that the acceleration of the ramp voltage need not be constant (e.g., 2×) but may be configured in virtually any manner as warranted by the particular application. Such an alternative scheme is shown in FIG. 1B, in which the individual ramp segments SEGMENT(1) through SEGMENT(4) may have slopes that are not integer multiples of one another.

In real world implementations, non-idealities such as charge injection, amplifier offset, finite amplifier gain, and component mismatch cause each of the SEGMENT(N) sections to have unpredictable ramp rates. In the general case, the difference from the intended step size may be independent for each SEGMENT so that the composite transfer function (digital number out vs. $V_{in}$) may be non-linear. In addition, these circuit non-idealities (such as amplifier offset) may drift over the lifetime of the circuit. STEP(1) through STEP(4) and Knee(1) through Knee(3) are illustrated in SEGMENT(1) through SEGMENT(4) in FIG. 1A. A non-ideal gain for SEGMENT(3) is shown in FIG. 1A along with an ideal SEGMENT(3). It can be seen from FIG. 1A that a non-ideal gain for a single section can cause integral non-linearity (INL). Correct linearity for the ADC assumes that the gain for STEP(4) is half of that of STEP(8) and twice that of STEP(2). However, a sampled voltage during SEGMENT(4) will not have a count that corresponds linearly to a voltage sampled during STEP(2) or STEP(8). Because only part of the voltage versus count curve has non-ideal gain, integral non-linearity results. If all sections were affected in the same way, an overall gain error would occur but the transfer function would be linear.

In order to have low integral non-linearity over the entire ramp, the ramp gains (expressed in Volts/digital number or Amps/digital number) or other measured quantity for each section must be accurate. Actually, for applications such as imaging or in the general case, applications including some form of AGC function in the system, only the ratios of the gains need to be accurate for a low integral non-linearity. If the overall gain is also of interest, accurate gain for each section is desired.

A typical ramp generator 10 may be implemented as a switched capacitor integrator, shown in FIG. 2. The circuit includes a high-gain differential amplifier 12. A switched capacitor network 14 at the input of the amplifier 12 that delivers discrete packets of charge to the amplifier 12. The amplifier has a capacitive feedback network 16 configured to provide negative feedback. The feedback forces the amplifier 12 to move ramp the output voltage in order to re-balance the inputs after each packet of charge is delivered. The size of the ramp step is proportional to the input voltage from a voltage source, such as a resistor ladder, and the ratio of the input capacitance to the output capacitance. One or both of the input voltage and the size of the input capacitance may be programmable. Persons of ordinary skill in the art will understand that other methods may be used to implement the ramp generator, such as a DAC or a continuous integrator driven by a constant current source.

The ramp generator of FIG. 2 may be used in an analog-to-digital converter 20 such as the one shown in FIG. 3 in which the ramp generator 10 is associated with a counter 22 driven from the same clock source 24 as the ramp generator 10. The output count of the counter 22 has a known relationship to the ramp voltage. An analog input voltage and the ramp voltage are compared in a comparator 26 and the output of the comparator 26 is used to trigger latch 28 to latch the output of the counter 22 when the ramp voltage equals the analog input voltage. The latched count, which has a known relationship to the ramp voltage, is thus a digital representation of the measured analog input quantity.

The major sources of error in the ramp gain arise from the input offset of the ramp amplifier and a differential charge injection error. The step size of the ramp generator (and therefore the gain in V/digital number) is proportional to the amount of charge injected at each step. For each possible setting, the step size is given a constant error by the charge injection. The offset of the amplifier gives an error which is proportional to the amount of capacitance used for the particular setting. The error due to capacitance mismatch will result in an error that is proportional to the input voltage. There may also be also errors in the reference voltages Vin and Vref used by the ramp generator that must be considered. Lastly, the finite amplifier gain will cause an error that is proportional to the output voltage, which creates a non-linearity in the ramp voltage.

There are other sources of gain error such as the relative size of the feedback capacitance. These errors will be the same for all setting. The gain errors common to all settings will result in an overall gain error, but will not result in integral non-linearity due to the accelerated ramp. The inaccuracies and non-idealities described above result in circuit area and/or power and/or cost constraints which mean this approach to Analog-Digital conversion is unattractive for modern integrated circuit implementation.

BRIEF DESCRIPTION

According to one aspect of the present invention, a method for operating a single slope analog-to-digital converter (ADC) includes providing a ramp generator to provide at least one voltage-ramp segment; applying delta-sigma modulation to the voltage-ramp generator to generate a delta-sigma modulated voltage ramp; operating a digital counter synchronously with the voltage-ramp generator; comparing the delta-sigma modulated voltage-ramp to an input voltage; and latching a count from the digital counter in response to the output of the comparator.

The method can be performed in a manner in which the delta-sigma modulation includes a first state in which the slope of the voltage ramp is decreased from a nominal value and a second state in which the slope of the voltage ramp is increased from the nominal value. The method can also be performed in a manner in which the delta-sigma modulation includes multiple states, for example a first state in which the slope of the voltage ramp is decreased from a nominal value, a second state in which the slope of the voltage ramp is increased from the nominal value, and a third state in which the slope of the voltage ramp is maintained at the nominal value.

According to another aspect of the present invention, a method for calibrating a ramp segment N for a single slope analog-to-digital converter (ADC) including a voltage ramp generator having a delta-sigma modulator (DSM) includes applying DSM and voltage references $DSM_i(R,N)$ to the voltage ramp generator to create output slope rate R for ramp segment N; applying a reference voltage $V_{cal}$ to the ADC; measuring the output of the ADC $ADC_{out,i}N,R$; calculating a new $DSM_{i+1}(R,N)$ as a function of $ADC_{out,i}N,R_i$; and calculating an expected ADC output for $DSM_{i+1}(R,N)$.

The calibration can be performed multiple times for noise averaging or can be performed iteratively for successively more accurate estimates for DSM(R,N).

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Figure 1A:
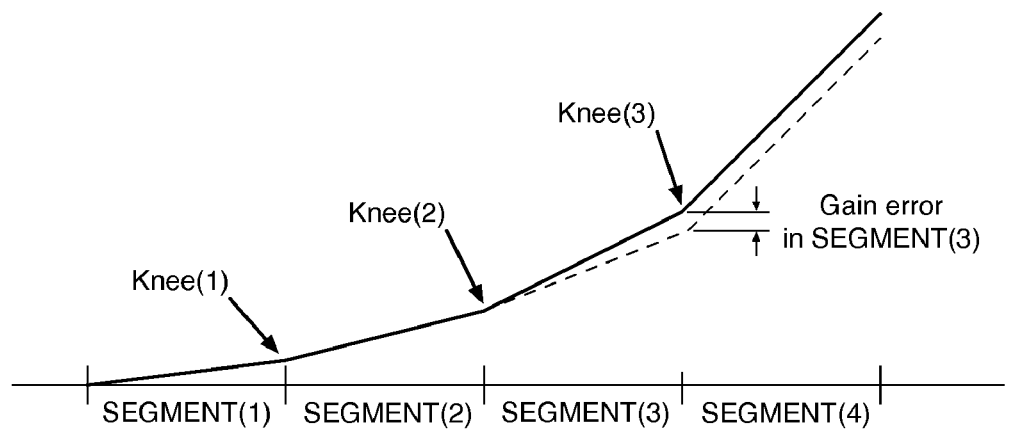
FIG. 1A is a representation of a multi-slope output from a ramp generator in which the slopes of successive ramp segments double.
Figure 1B:
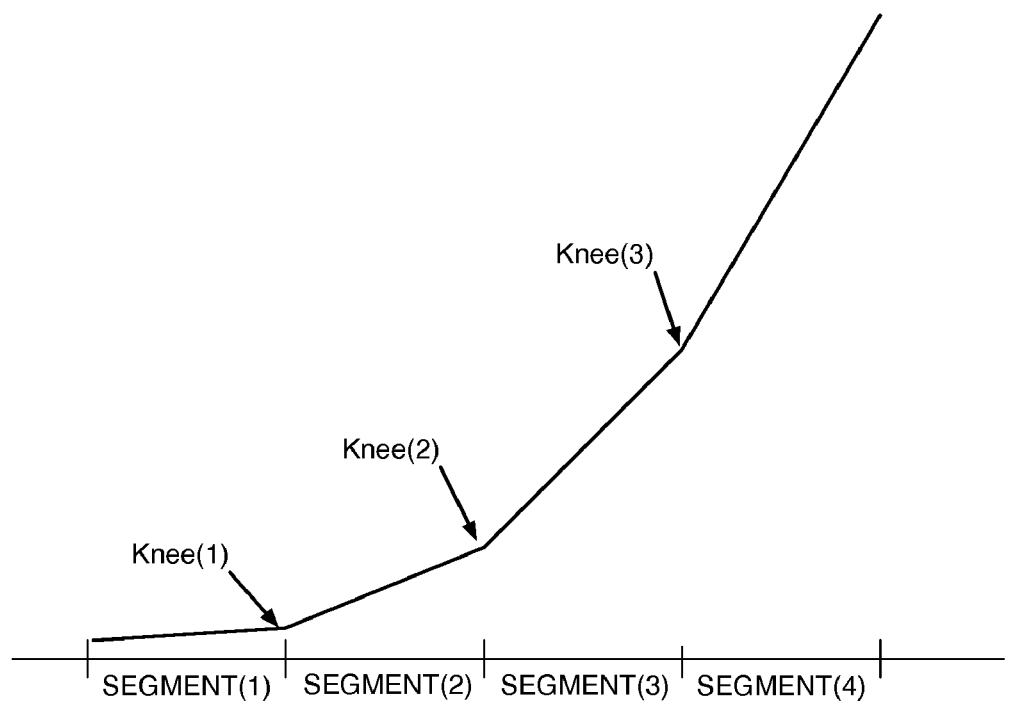
FIG. 1B is a representation of a more general multi-slope output from a ramp generator in which the slopes of successive ramp segments are different from one another.
Figure 2:
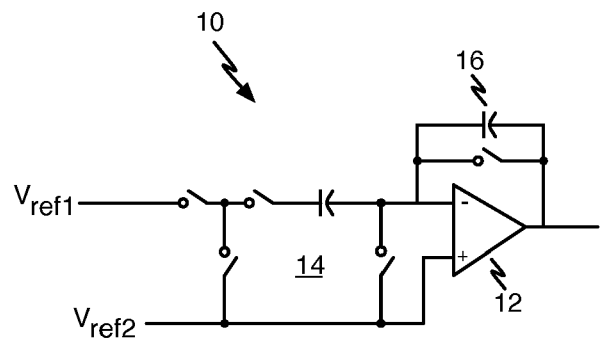
FIG. 2 is a simplified schematic diagram of a prior-art ramp generator circuit.
Figure 3:
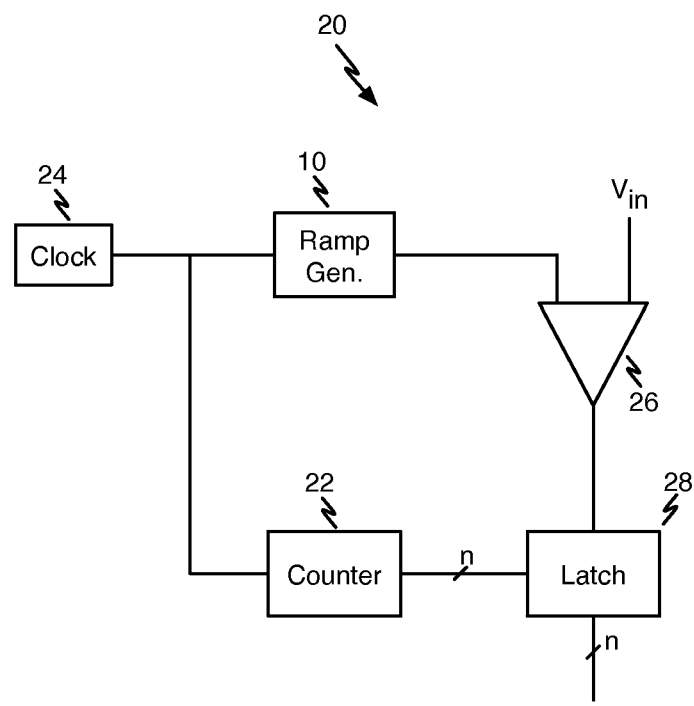
FIG. 3 is a block diagram of a prior-art analog-to-digital converter.
Figure 4:
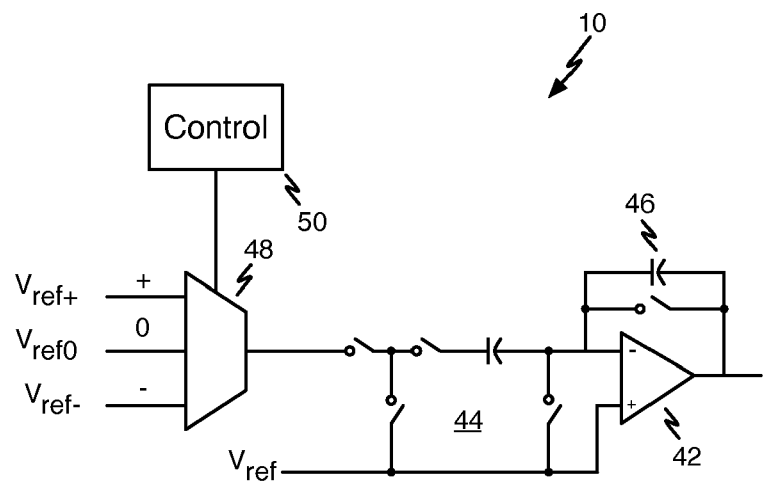
FIG. 4 is a block diagram of a ramp generator circuit according to one aspect of the present invention.

Referring now to FIG. 4, a block diagram shows an illustrative ramp generator circuit 10 according to one aspect of the present invention Like the prior-art ramp generator, ramp generator circuit 10 includes a high-gain differential amplifier 42. A switched capacitor network 44 at the input of the amplifier 42 that delivers discrete packets of charge to the amplifier 42. The amplifier has a capacitive feedback network 46 configured to provide negative feedback. The feedback forces the amplifier 42 to move ramp the output voltage in order to re-balance the inputs after each packet of charge is delivered. The size of the ramp step is proportional to the input voltage from a reference voltage source, such as a resistor ladder, and the size of the input capacitance. One or both of the input voltage and the size of the input capacitance may be programmable. The components in FIG. 4 are shown as singled-ended for simplicity. Persons of ordinary skill in the art will appreciate that differential circuits that perform the same function are contemplated within the scope of the present invention and may be preferred for some applications.

Ramp generator circuit 10 also includes a multiplexer 48 driven by a control circuit 50. Multiplexer 48 provides a plurality of voltages to the input of the switched capacitor network in order to dither the ramp output signal to produce a delta-sigma modulated (DSM) ramp voltage. As shown in FIG. 4, three voltages, Vref−, Vref0 and Vref+ are provided to the input s of the multiplexer 48. The control circuit 50 drives the select inputs of multiplexer 48 to select one of the three voltages, $V_{ref-}$, $V_{ref0}$ and $V_{ref+}$ to the switched capacitor network 44 of the ramp generator 10. In some embodiments, two voltages, $V_{ref-}$ and $V_{ref+}$ are provided to the inputs of the multiplexer 48.

Figure 5:
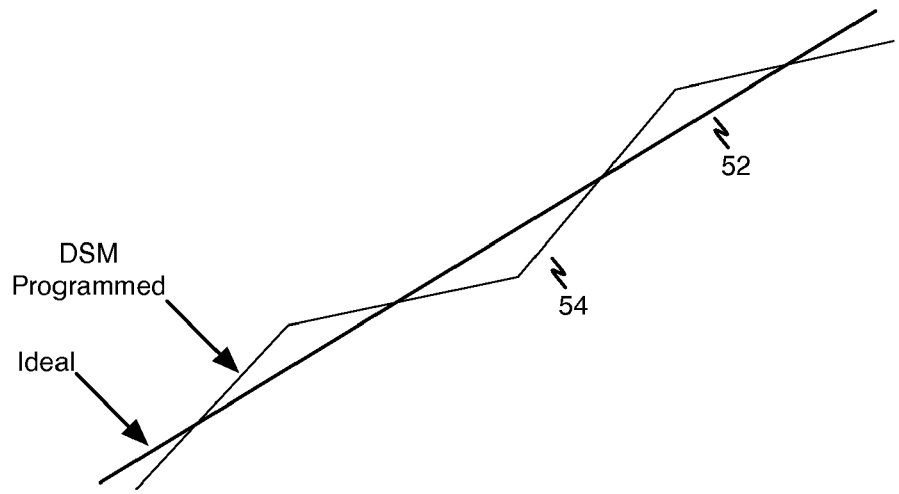
FIG. 5 is a representation of the output of the ramp generator circuit of FIG. 4.

FIG. 5 is a representation of the output of the ramp generator circuit of FIG. 4. The ideal ramp output is shown at reference numeral 52 and the DSM ramp voltage is shown at reference numeral 54. The DSM ramp voltage shown in FIG. 5 is generated using the two voltages, $V_{ref-}$ and $V_{ref+}$.

Figure 6:
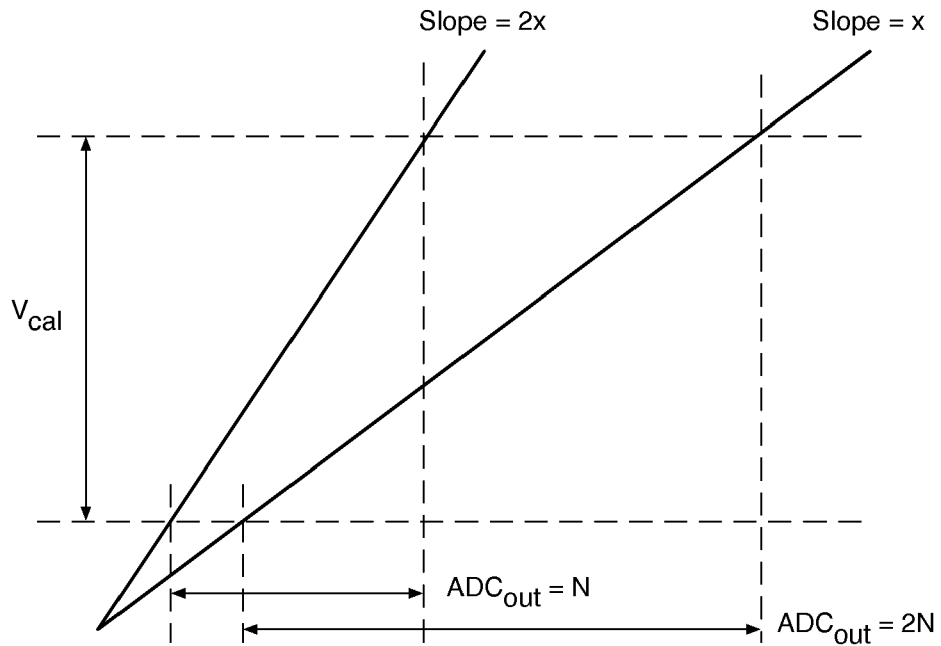
FIG. 6 is a diagram illustrating a method for calibrating the output of a multislope ramp generator in which the slopes of successive ramp segments double.
Figure 7:
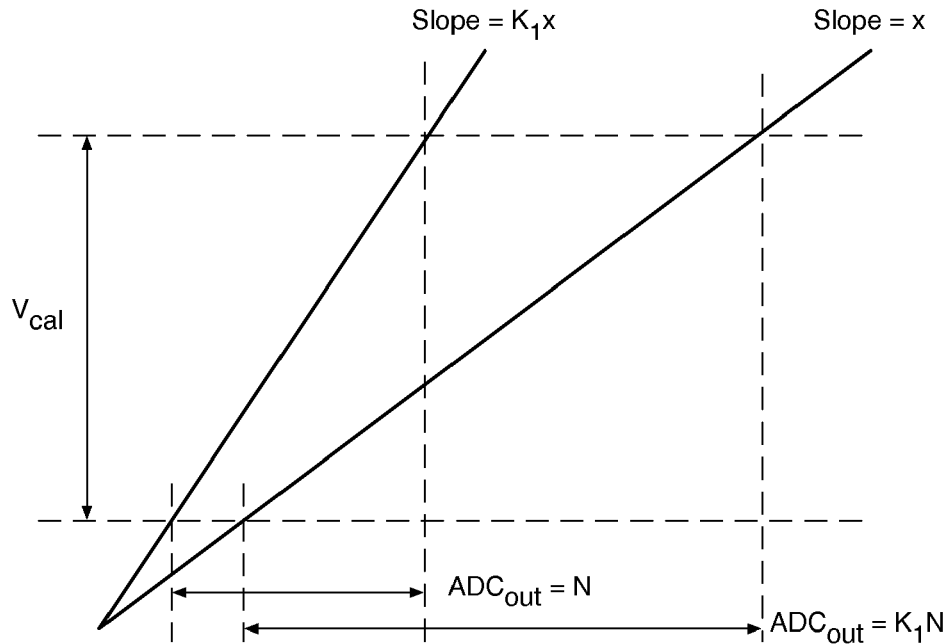
FIG. 7 is a diagram illustrating a method for calibrating the output of a multislope ramp generator in which the slopes of successive ramp segments are mathematically related to one another.

According to the present invention, the ramp voltage is calibrated and then the ramp generator is operated in accordance with the calibration information. The calibration principle is illustrated in FIGS. 6 and 7. First, referring to FIG. 6, a first ramp is shown having a slope equal to 1× and a second ramp is shown having a slope equal to 2×. A calibration voltage $V_{cal}$ applied to the input of the ADC should result in an ADC output count of N when using the 2× slope ramp and a count of 2N when using the 1× slope ramp. Any variation from the expected N/2N counts represents a non-linearity between the two ramps.

Referring now to FIG. 7, the calibration principle may be generalized by considering a first ramp having a slope equal to 1× and a second ramp having a slope equal to $K_1 x$. A calibration voltage $V_{cal}$ applied to the input of the ADC should result in an ADC output count of N when using the $K_1 x$ slope ramp and a count of $K_1 N$ when using the 1× slope ramp. Any variation from the expected $N/K_1 N$ counts represents a non-linearity between the two ramps.

In both of the examples of FIGS. 6 and 7, any variation from the expected results may be used to calibrate the ramps. To illustrate this as aspect of the present invention, consider the case of the 1× ramp in FIG. 6, where a voltage of 1.2 volts is expected to result in an ADC output count of 120. The expected output count is stored in a register. The actual ADC output count is compared to the expected count to obtain the direction of the error (i.e., plus or minus), and the magnitude of the error (the number of counts by which the actual count differs from the expected count. This information is used to calibrate the ramp generator.

Figure 8:
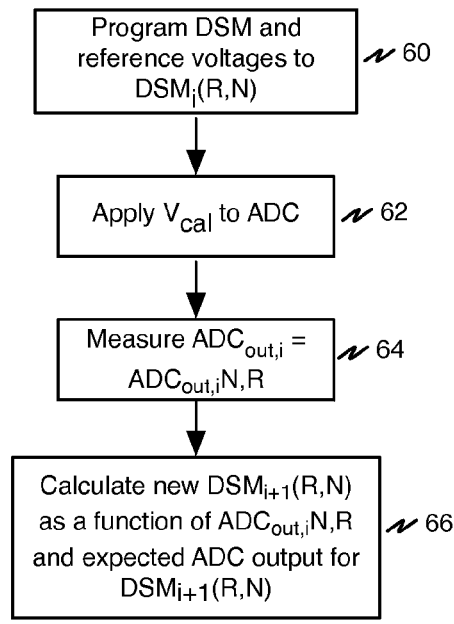
FIG. 8 is a flow diagram illustrating a calibration procedure according to one aspect of the present invention.

Referring now to FIG. 8, a flow diagram illustrates a method for calibrating the ramp generator according to one aspect of the present invention. First, at reference numeral 60, the DSM and voltage references are programmed to $DSM_i(R, N)$ for the ramp generator to create output slope rate R for segment N. Next, at reference numeral 62, a reference voltage $V_{cal}$ is applied to the ADC. Next, at reference numeral 64, the output of the ADC is measured, ADC output=$ADC_{out,i} N,R$. Next, at reference numeral 66 a new $DSM_{i+1}(R,N)$ is calculated as a function of $ADC_{out,i} N,R$ and the expected ADC output for $DSM_{i+1}(R,N)$ is also calculated. $DSM_{i+1}(R,N)$ is a closer estimate than $DSM_i(R,N)$ for the DSM settings required for the ADC to generate the desired output count when measuring $V_{cal}$. It may be desirable to repeat this procedure either multiple times (for noise averaging) or iteratively for successively more accurate estimates for DSM(R, N).

The exact formula to be used for the calculation depends on the number system chosen for the DSM and on the interpretation of DSM outputs by the reference generation block but will generally calculate the new DSM programming value as the previous value multiplied by the ratio of the expected ADC output to the measured ADC output.

The procedures shown at reference numerals 62 through 66 may be executed more than one time for each ramp segment with second and subsequent executions being used to compensate either for non-idealities in the $V_{ref+}$ and $V_{ref-}$ values, or for noise averaging. The procedures shown at reference numerals 62 through 66 will be repeated for each ramp segment that is to be calibrated.

As will be appreciated by persons of ordinary skill in the art, if absolute accuracy is desired from the ADC then the absolute value of $V_{cal}$ must be known within an acceptable limit, and $V_{cal}$ will usually be derived from a bandgap reference which might even be trimmed.

In many applications the ADC will fall within some kind of gain control loop and it is acceptable to have only a rough idea of $V_{cal}$. The acceptable limits might be quite wide such that a bandgap reference is not necessary. In addition, the variability in ramp rates deriving from the errors in $V_{ref+}$ and $V_{ref-}$ may be sufficiently small that one or more ramp SEGMENTs have a ramp rate which is acceptably accurate. In either case it may be decided to either calibrate all ramp segments to a single measured segment which is not calibrated, but merely measured, and thus the ramp generator may be operated either with the DSM programmed to produce some "mid-point" slope or with the DSM turned off (i.e., with some fixed slope).

Figure 9:
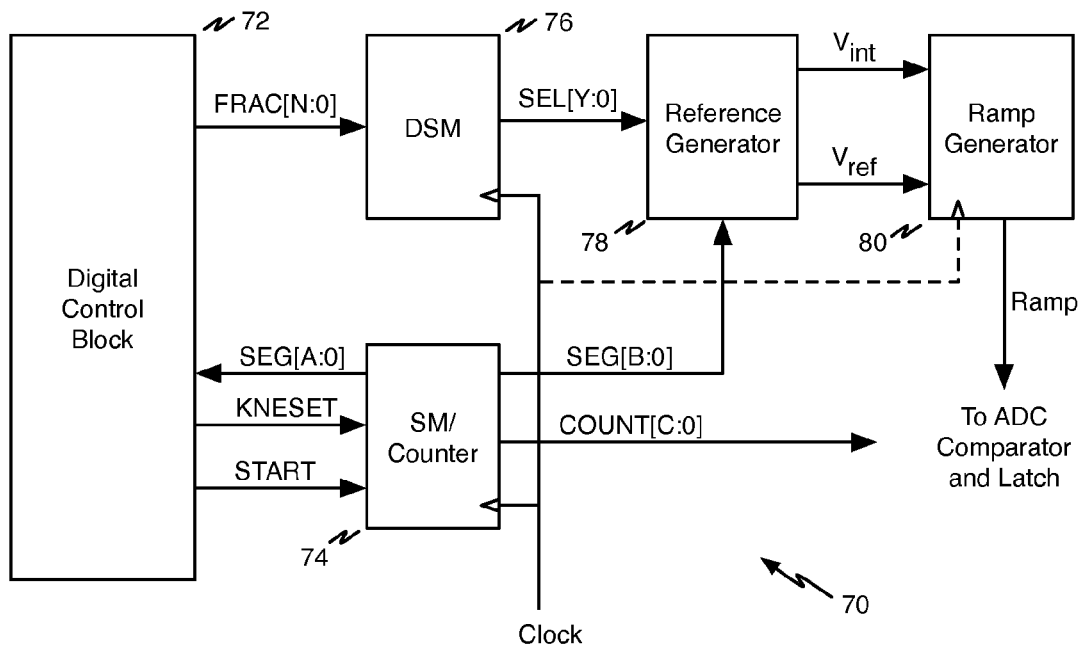
FIG. 9 is a block diagram of a control circuit for an analog-to-digital converter according to one aspect of the present invention.

Referring now to FIG. 9, a block diagram shows an illustrative control circuit 70 for calibrating the ADC in accordance with the present invention. Control circuit 70 includes digital control block 72 including a set of digital control registers controlled by, for example, a state machine. The registers in digital control block 72 store the value FRAC[N:0] that is a fractional value representing target slope for current ADC ramp segment. Digital control block registers 72 also store KNESET that is information telling counter where on the ramp function knees are to be placed. SEG[A:0] is a digital value from counter representing which ramp segment the ramp generator should be producing. IN response to the SEG[A:0] value, the digital control block produces the corresponding FRAC[N:0] value.

SM/counter 74 comprising a state machine and a digital counter is used to supply the count to the ADC. Counter 74 is clocked by the clock signal and receives the value KNESET from the digital control block 72 to tell the SM/counter where on the ramp function the knees are to be placed. SM/counter 72 outputs SEG[A:0] to the control block 72. SM/counter 72 also outputs SEG[B:0], which is the same information as SEG[A:0], and may be the same bits or different bits depending upon specific circuit implementation of the reference generator and control registers. SM/counter 72 also outputs COUNT[C:0], the SM/counter output value to the ADC latch(es). The counter portion of SM/counter 72 is often, but need not be, a Gray code counter.

DSM 76 is also clocked by the clock signal and receives the value FRAC[N:0] from the digital control block 72. DSM 76 outputs SEL[Y:0], a (one or more bit) code telling the reference block to output reference values to the ramp generator representative of +, 0 and − values or + and − values to drive the reference generator 78. More than three levels are also possible, depending on the number of quantizer bits in the DSM, which correspond to log 2(# of levels) and on the desired level of granularity in ramp rates.

Reference generator 78 generates the Vint and Vref—inputs to the ramp generator 80 to determine the instantaneous ramp rate. Ramp generator 80 may be a time-discrete circuit (e.g., a switched capacitor integrator) in which case it is clocked from same clock as the DSM and Counter, or a time-continuous circuit. The output from the ramp generator, designated Ramp, is a continuous output ramp signal to the ADC comparator(s). Persons of ordinary skill in the art will recognize that many circuit implementations of this same concept are possible, and that the implementation described is not unique. For example, the Digital Control Block, the DSM and the SM/Counter may be implemented as a single digital circuit. The Reference Generator and Ramp Generator may also be implemented as a single, integrated circuit. In such implementations, the Ramp output may be a step function, as produced by the implementation described here, or a continuous signal, such as one produced by a continuous integrator or a DAC.

Figure 10:
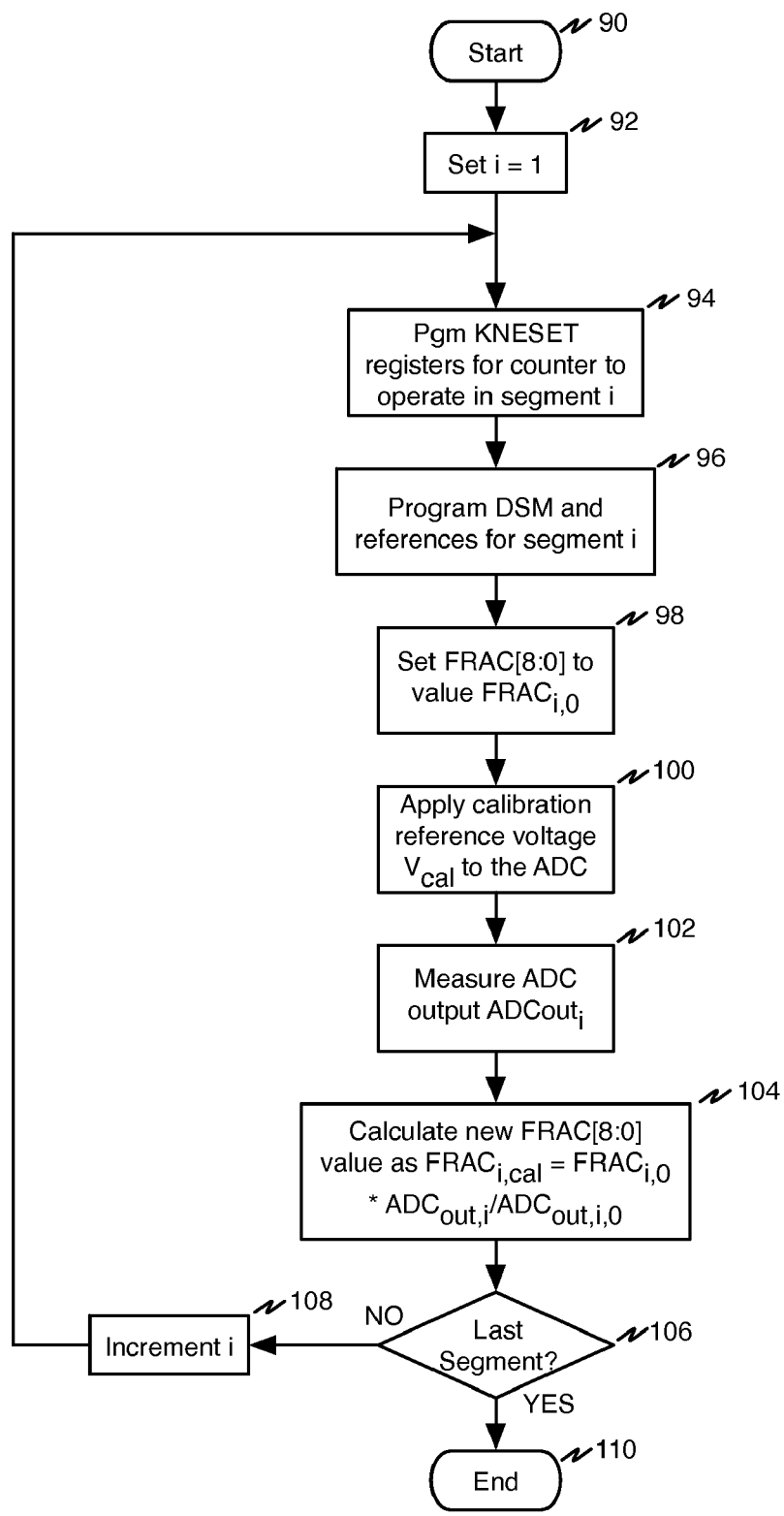
FIG. 10 is a flow diagram illustrating a calibration procedure according to another aspect of the present invention.

Referring now to FIG. 10, a flow chart illustrates a particular illustrative non-limiting example of a calibration procedure according to one aspect of the present invention. In the example shown in FIG. 10, the ramp to be generated by the ADC includes i segments and is controlled by the control hardware shown in FIG. 9.

The process starts at reference numeral 90. At reference numeral 92, I is set=1. Next, at reference numeral 94, the KNESET registers are programmed so that the counter is operating in segment i. The counter will set the $SEG_i[A:0]$ and $SEG_i[B:0]$ values to indicate to the reference block and digital control registers in which ramp segment the ADC should be operating.

At reference numeral 96, the DSM and references are programmed for segment i. At reference numeral 98, $FRAC_i[8:0]$ is set to the value $FRAC_i,0$, representing mid-point of adjustable slope range for segment i. The DSM will then set SEL [Y:0] so that reference generator creates the $V_{int}-V_{ref}$ voltage difference for the ramp generator 80.

Next, at reference numeral 100, a calibration reference voltage $V_{cal}$ suitable for the ADC is sent from the reference generator to the ADC. $V_{cal}$ is chosen such that quantization errors/noise, reference noise/ripple, etc., and other numerical errors are sufficiently small for the desired level of ADC linearity to be achieved. At reference numeral 102, the ADC output $ADCout_i$ is measured. This quantity is the $COUNT_i$ [C:0] value latched by the comparator in the ADC.

Next, at reference numeral 104, a new $FRAC_i[8:0]$ value is calculated as $FRAC_i,cal=FRAC_i,0*ADCout_i/ADCout_i,0$ where $ADCout_i,0$ is the expected ADC output for segment i when measuring $V_{cal}$. The exact formula may change somewhat depending on numbering systems and design of the reference block and ramp generator. It is possible (but not necessary) to design the blocks such that this simple formula applies.

Next, at reference numeral 106, it is determined if the current ramp segment is the final ramp segment. If not, at reference numeral 108, i is incremented and the process returns to reference numeral 94 with the new i value. If the current ramp segment is the final ramp segment, the process ends at reference numeral 110.

Persons of ordinary skill in the art will recognize that it is possible, even likely, that all ramp segments will not have to be calculated. However, a method to calibrate all of the settings is described.

A single pass measurement for calibration may not always be sufficient. One problem is that the resistor ladder or other circuits used to create the reference voltages for the ramp generator 80 are not perfectly accurate. Another problem is the large quantization noise for large step sizes. Yet another problem may be that circuit noise levels cause a single measurement to be incorrect and thus result in ADC INL.

To address the voltage reference inaccuracy, it may be useful to make two or more passes through the calibration measurement. A first pass through could be used to determine the sign of the gain error for a particular setting. If the approximate correction ratio is known for the corresponding voltage tap, then an estimate can be made for the adjusting signal. A second pass could then be made through the measurement phase with the first guess at the adjusting signal applied. The gain could be re-measured and the final value of the adjusting signal could be applied.

To address the quantization noise, the $V_{cal}$ voltage may be further considered. During calibration, it was first assumed that the calibration voltage was chosen arbitrarily. However, if the calibration voltage is chosen to be exactly N times the number of steps for the present SEGMENT, the digital adjust value can be adjusted iteratively so that the minimum adjust value that gives N is achieved, and decreasing the adjust value any lower gives N+1 steps. This iterative approach allows the gain to be adjusted to an arbitrary precision (absent noise) limited only by the quantization of the DSM.

While embodiments and applications of this invention have been shown and described, it would be apparent to those skilled in the art that many more modifications than mentioned above are possible without departing from the inventive concepts herein. For example, the circuits may be constructed to measure and work with quantities in the current domain rather than the voltage domain. The invention, therefore, is not to be restricted except in the spirit of the appended claims.

What is claimed is:

1. A method for calibrating a ramp segment N for a single slope analog-to-digital converter (ADC) including a voltage ramp generator having a delta-sigma modulator (DSM), the method comprising:

applying DSM and voltage references $DSM(R_i,N)$ to the voltage ramp generator to create output slope rate $R_i$ for ramp segment N;

applying a reference voltage Vcal to the ADC;

measuring the output of the ADC $ADC_{out,i}N,R_i$; and calculating a new $DSM_i+1(R,N)$ as a function of $ADC_{out,i}N,R_i$ and an expected ADC output for Vcal.

2. The method of claim 1 wherein the function of $ADC_{out,i}N,R_i$ is $ADC_{out,i}N,R_i$ multiplied by the ratio of the expected ADC output to the measured ADC output.

3. The method of claim 1 performed multiple times for noise averaging.

4. The method of claim 1 performed iteratively to provide successively more accurate estimates for DSM(R,N).

5. A method for calibrating more than one ramp segment comprising:

measuring the output of an ADC at the end of a first ramp segment;

measuring the ADC output of the ADC at the end of a second ramp segment;

calculating the DSM for the second ramp segment as a function of the ADC output measured at the end of the first ramp segment and the ADC output measured at the end of the second ramp segment, and the relative slope difference between the first and second segments.

* * * * *